(12) United States Patent
Nosho et al.

(10) Patent No.: US 10,157,929 B2
(45) Date of Patent: Dec. 18, 2018

(54) COMMON SOURCE LINE WITH DISCRETE CONTACT PLUGS

(71) Applicant: SanDisk Technologies LLC, Plano, TX (US)

(72) Inventors: Yosuke Nosho, Yokkaichi (JP); Erika Kanezaki, Yokkaichi (JP); Ryo Nakamura, Yokkaichi (JP)

(73) Assignee: SanDisk Technologies LLC, Addison, TX (US)

( * ) Notice: Subject to any disclaimer, the term of this patent is extended or adjusted under 35 U.S.C. 154(b) by 15 days.

(21) Appl. No.: 14/734,888

(22) Filed: Jun. 9, 2015

(65) Prior Publication Data
US 2016/0284718 A1  Sep. 29, 2016

Related U.S. Application Data

(63) Continuation-in-part of application No. 14/667,076, filed on Mar. 24, 2015, now Pat. No. 9,461,059.

(51) Int. Cl.
| | | |
|---|---|---|
| H01L 27/11519 | (2017.01) | |
| H01L 23/532 | (2006.01) | |
| H01L 27/115 | (2017.01) | |
| H01L 27/11524 | (2017.01) | |
| H01L 29/66 | (2006.01) | |

(52) U.S. Cl.
CPC .. H01L 27/11524 (2013.01); H01L 29/66825 (2013.01)

(58) Field of Classification Search
CPC ............................ H01L 23/532; H01L 27/115
See application file for complete search history.

(56) References Cited

U.S. PATENT DOCUMENTS

| | | | |
|---|---|---|---|
| 5,568,421 A * | 10/1996 | Aritome | G11C 16/0416 257/316 |
| 5,604,158 A | 2/1997 | Cadien et al. | |
| 6,103,623 A | 8/2000 | Lien et al. | |
| 2007/0036000 A1* | 2/2007 | Kutsukake | G11C 16/3468 365/185.17 |
| 2008/0179746 A1 | 7/2008 | Hur et al. | |
| 2013/0214415 A1 | 8/2013 | Pachamuthu et al. | |
| 2014/0219024 A1* | 8/2014 | Ogi | G11C 16/10 365/185.11 |
| 2014/0231896 A1 | 8/2014 | Matsumori et al. | |
| 2014/0286103 A1* | 9/2014 | Akou | G11C 16/24 365/185.21 |
| 2015/0228582 A1 | 8/2015 | Sel et al. | |

(Continued)

OTHER PUBLICATIONS

Notice of Allowance and Fee(s) Due dated May 27, 2016 in U.S. Appl. No. 14/667,076. 7 pages.
U.S. Appl. No. 14/667,076, filed Mar. 24, 2015, 17 pages.

*Primary Examiner* — Joseph C Nicely
*Assistant Examiner* — Lamont Koo
(74) *Attorney, Agent, or Firm* — Vierra Magen Marcus LLP

(57) ABSTRACT

A method of forming a NAND flash memory includes forming a conductive area in a substrate, the conductive area extending along a direction that is perpendicular to the direction along which NAND strings extend, the conductive area connecting terminals of NAND strings. Discrete contact areas in the conductive area are contacted by discrete contact plugs, each contact plug contacting a corresponding contact area in the conductive area.

18 Claims, 18 Drawing Sheets

(56) References Cited

U.S. PATENT DOCUMENTS

| | | | |
|---|---|---|---|
| 2015/0263016 A1* | 9/2015 | Cha | G11C 16/0483 257/314 |
| 2015/0332953 A1 | 11/2015 | Futase et al. | |
| 2016/0035738 A1 | 2/2016 | Kakegawa et al. | |
| 2016/0086848 A1 | 3/2016 | Shishido et al. | |
| 2016/0126179 A1 | 5/2016 | Takahashi et al. | |

* cited by examiner

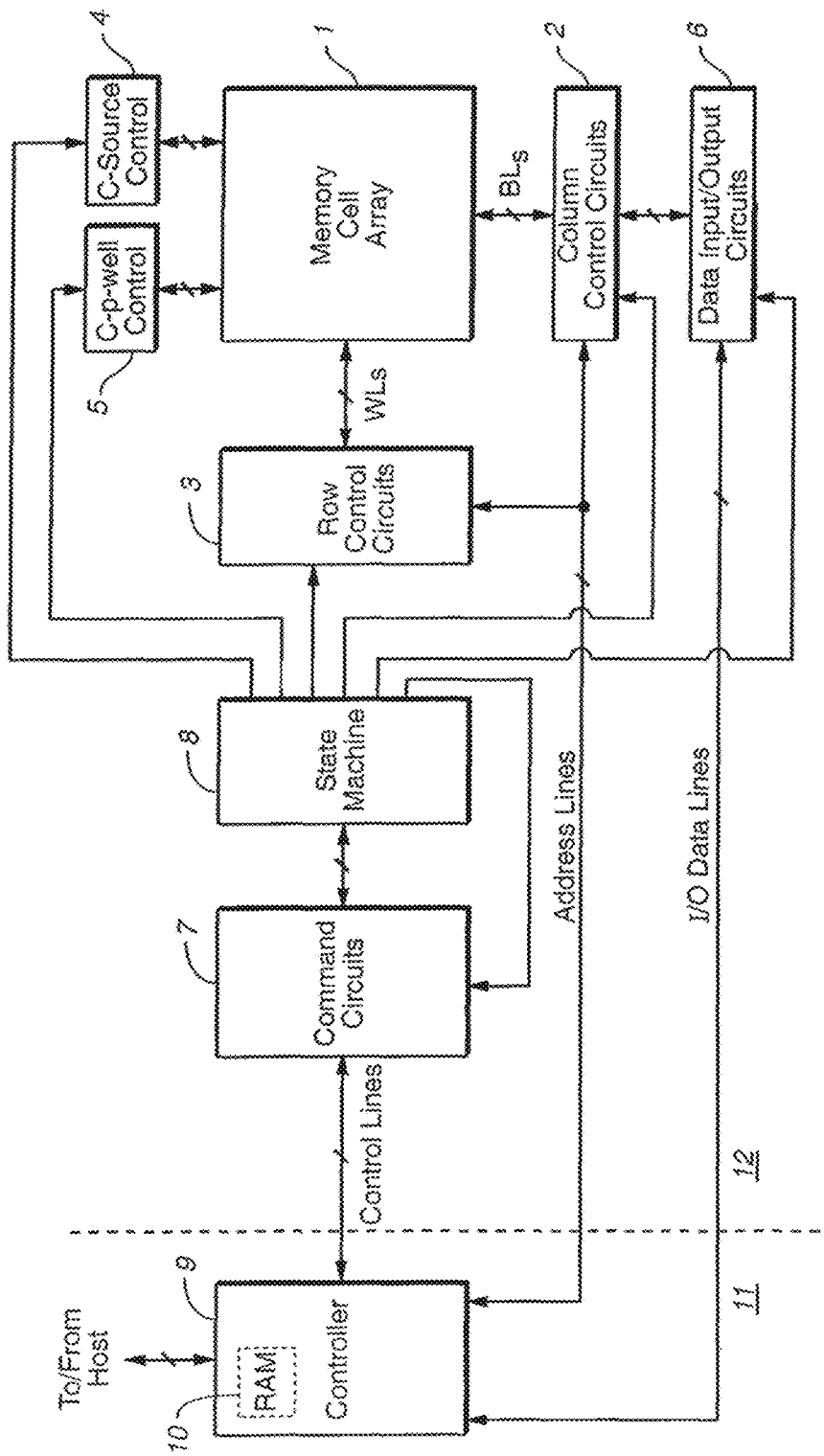
FIG._1
(Prior Art)

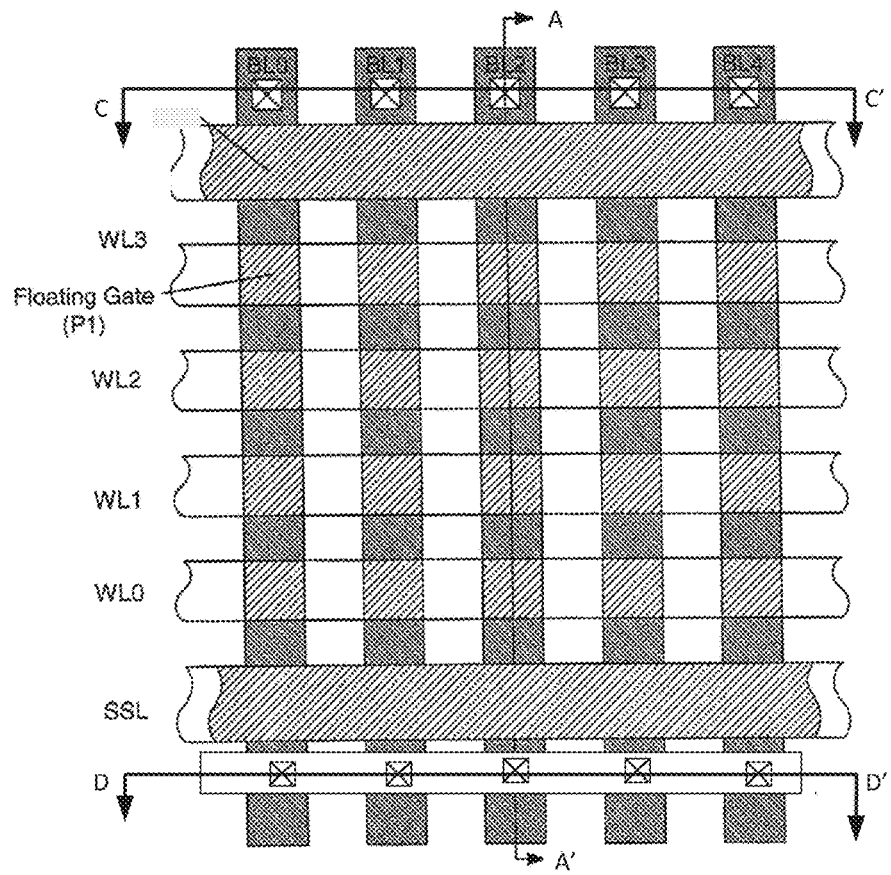
*FIG._2A (PRIOR ART)*
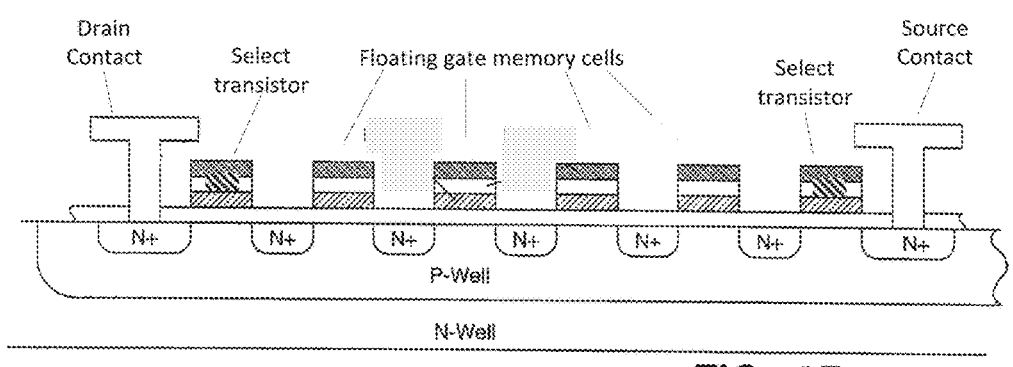
*FIG._2B (PRIOR ART)*
(Section A-A)

(Section C-C')

(Section D-D')

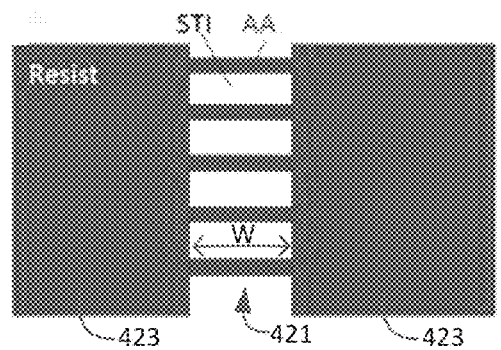
FIG. 4
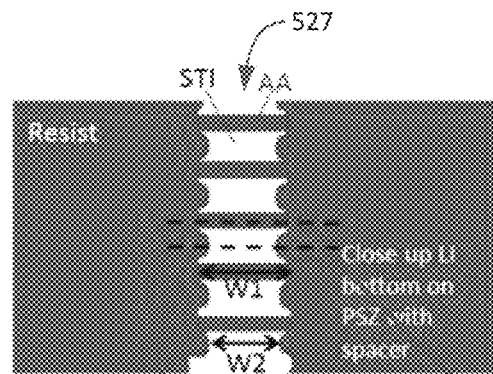
FIG. 5A
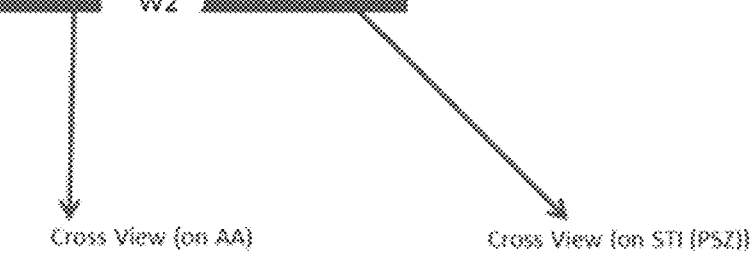
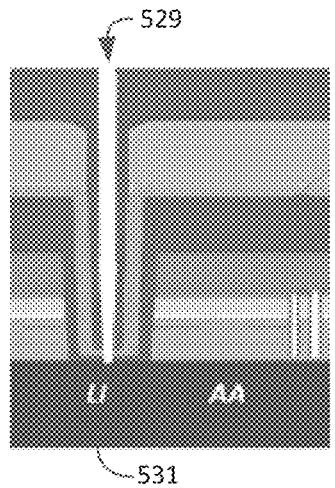
FIG. 5B
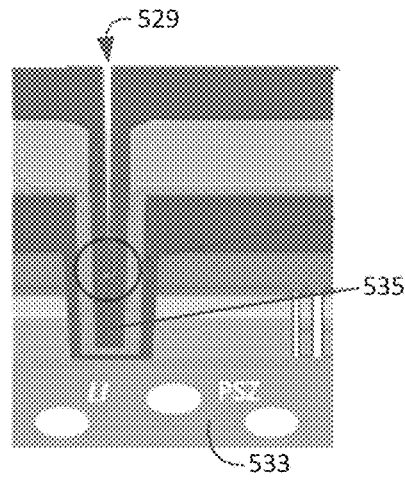
FIG. 5C

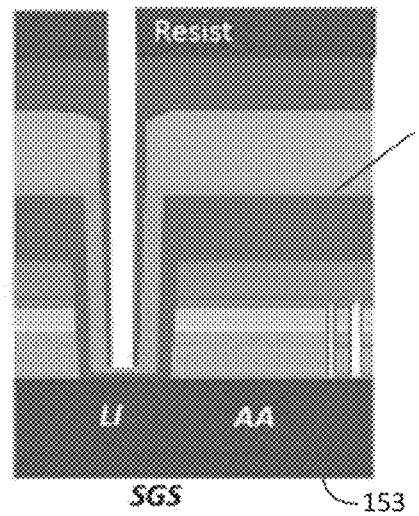 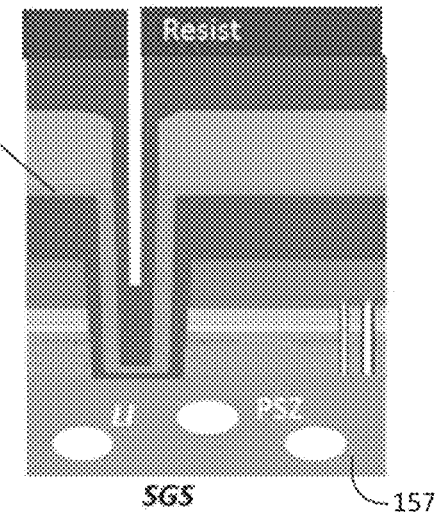
FIG. 10A  FIG. 10B
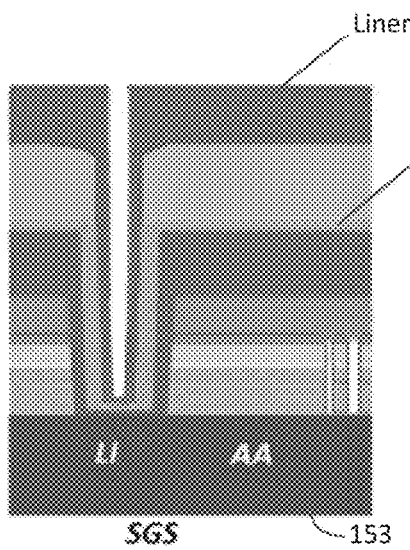 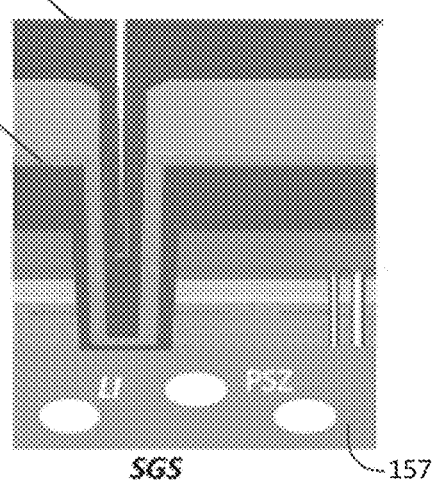
FIG. 11A  FIG. 11B

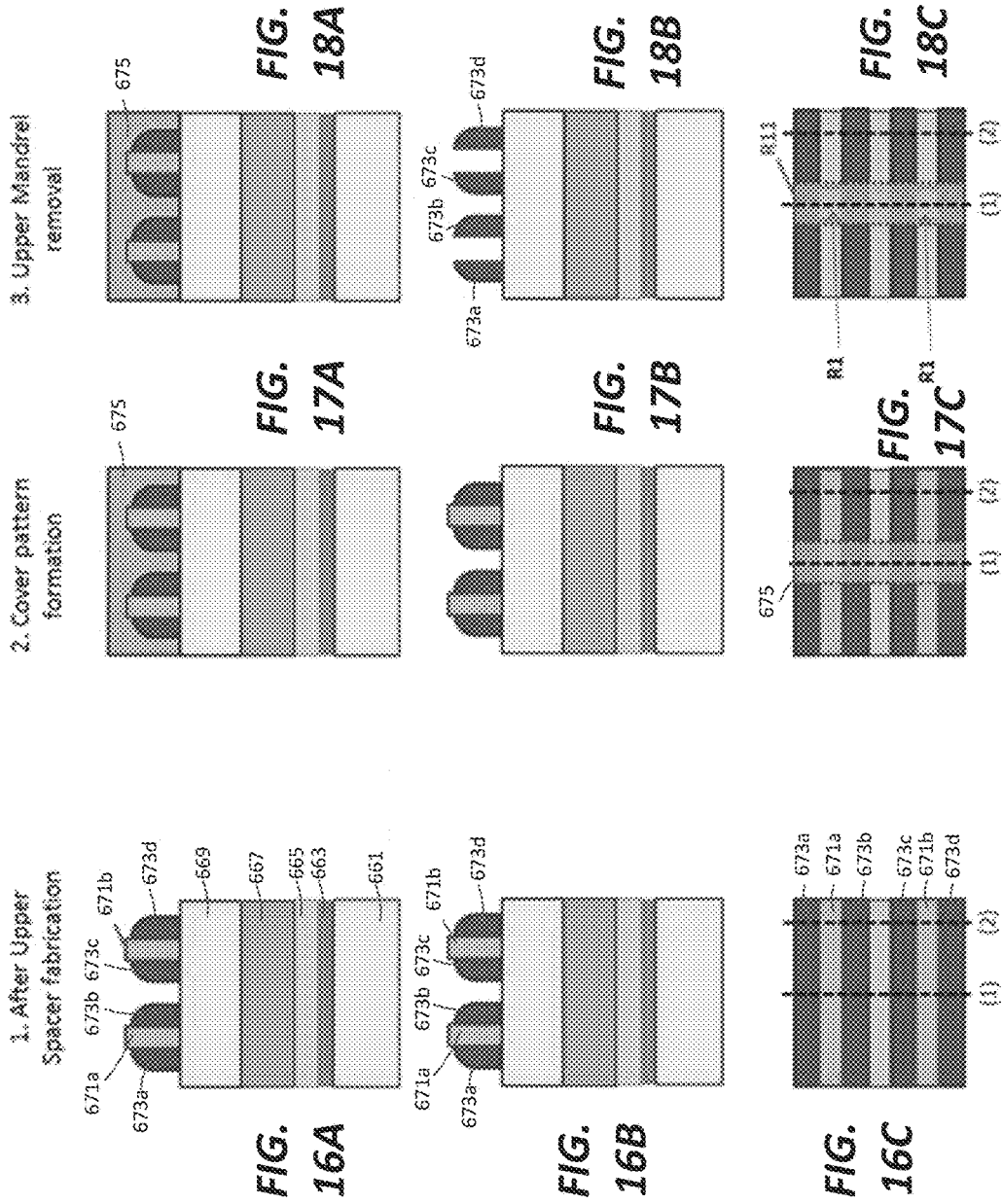

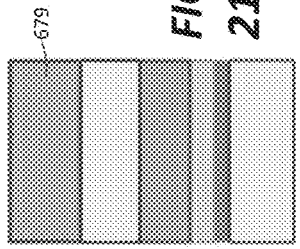
4. Lower Mandrel dry etching
*FIG. 19A*
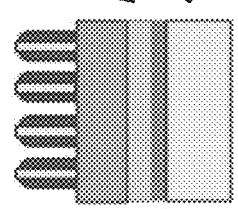
*FIG. 19B*
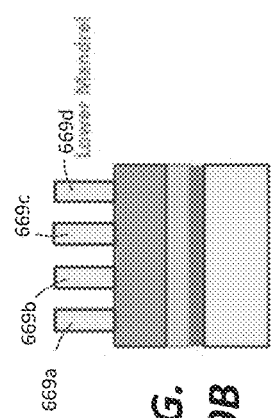
*FIG. 19C*
5. Slimming & Lower Spacer formation
*FIG. 20A*
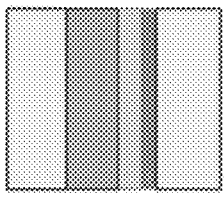
*FIG. 20B*
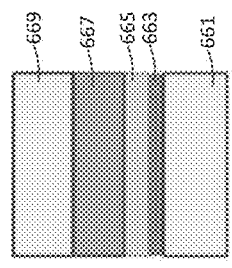
*FIG. 20C*
6. Cover pattern formation
*FIG. 21A*
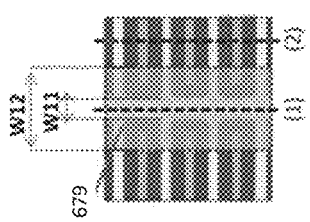
*FIG. 21B*
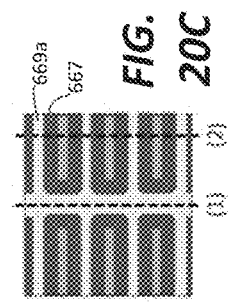
*FIG. 21C*
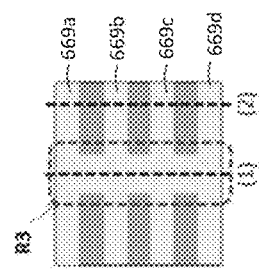

7. Lower Mandrel removal

8. Mask & STI dry etch

Top view

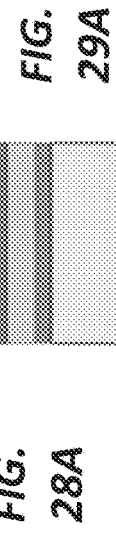
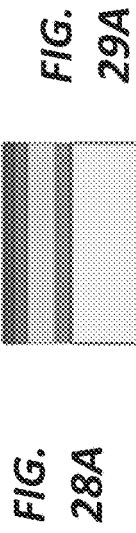
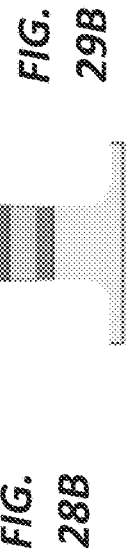
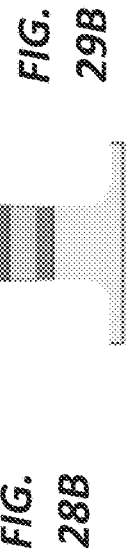
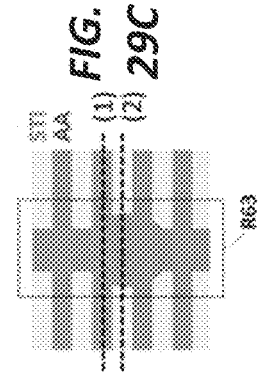
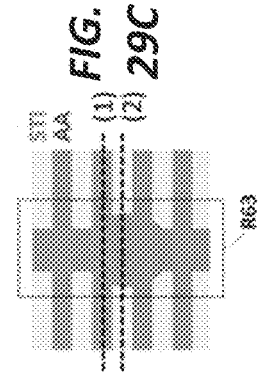
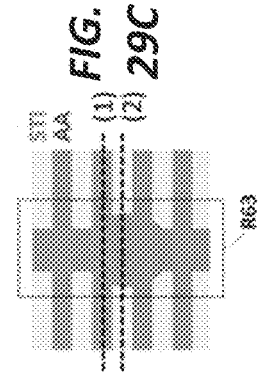
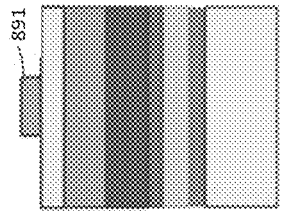
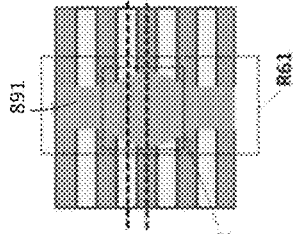
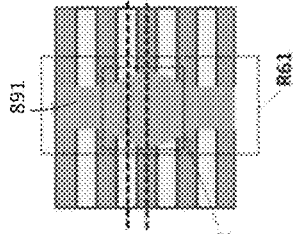
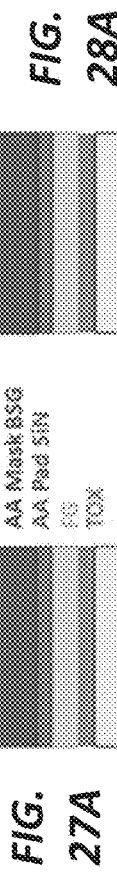
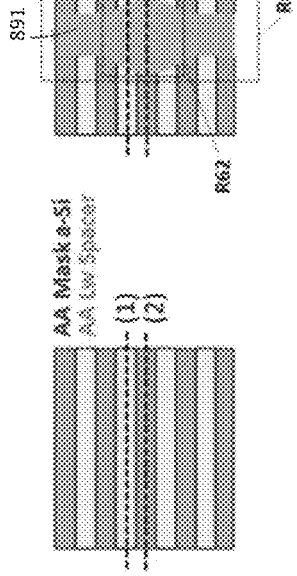
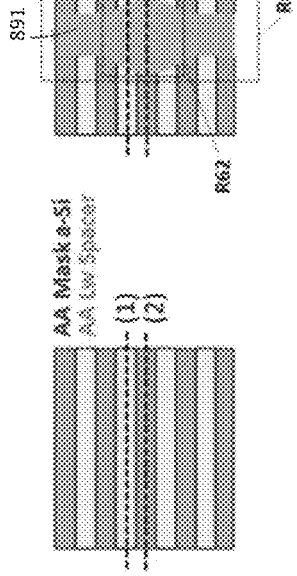
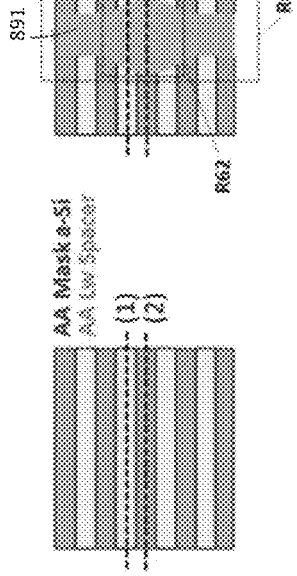
FIG. 27A, FIG. 27B, FIG. 27C — 1. After AA Lw Spc RIE
FIG. 28A, FIG. 28B, FIG. 28C — 2. PA PEP
FIG. 29A, FIG. 29B, FIG. 29C — 3. STI RIE

COMMON SOURCE LINE WITH DISCRETE CONTACT PLUGS

This application is a continuation-in-part of U.S. patent application Ser. No. 14/667,076, filed on Mar. 24, 2015, which is hereby incorporated by reference in its entirety.

BACKGROUND

This application relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a prior art flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of a string connect to a global bit line and a common source line respectively through select transistors (source select transistor and drain select transistor). Select transistors are used to connect NAND strings to control circuits when they are to be accessed, and to isolate them when they are not being accessed. Select transistors may be larger than the transistors that form nonvolatile memory cells and select lines may be wider than word lines. In general, it is desirable to form both word lines (which are relatively narrow) and select lines (which are relatively wide) in the same layer or layers using a common pattern.

At either end of a NAND string there is a contact area formed in the silicon substrate to allow the NAND string to be electrically connected. Contact areas in FIG. 2B are N+ doped areas in the substrate formed by implantation in a P-well. A drain contact formed of metal contacts the contact area on the drain side of the NAND string and a source contact also formed of metal contacts the contact area on the source side of the NAND string. Forming such contacts presents various problems as device sizes scale to ever-smaller dimensions.

SUMMARY

In an example of NAND flash memory formation, source ends of NAND strings are connected together in the substrate by forming a conductive area in the substrate that extends perpendicular to the NAND strings (and to the STI structures between NAND strings) and that connects source terminals of NAND strings. Discrete contact plugs contact the conductive areas at discrete contact areas within the conductive area. The conductive area may be shaped to facilitate discrete contact areas that maintain an adequate distance from STI structures so that the risk of STI structures being exposed to etching is low.

An example of a NAND flash memory includes: a plurality of NAND strings formed in a substrate, each of the plurality of NAND strings extending along a first direction between a first terminal and a second terminal; a conductive area in the substrate that extends along a second direction that is perpendicular to the first direction, the conductive area connecting first terminals of the plurality of NAND strings; a plurality of discrete contact areas in the conductive area; and a plurality of discrete contact plugs, each contact plug contacting a corresponding contact area in the conductive area.

The contact areas may be located at first terminals of alternate NAND strings of the plurality of NAND strings. The contact areas may be located at first terminals of every fourth NAND string of the plurality of NAND strings. The contact plugs may have an oval shape that is elongated along the first direction. Shallow trench isolation (STI) structures may extend along the first direction between the plurality of NAND strings. The STI structures may have unequal lengths along the first direction and the plurality of contact areas may be aligned with shorter STI structures. The longer STI structures may extend between neighboring contact areas. The first terminal may be a source terminal and the plurality of discrete contact plugs may connect to a common source line. The second terminal may be a drain terminal and a plurality of drain contact plugs may connect to the drain terminals. Each of the plurality of discrete contact plugs may be shared between two or more NAND strings of the plurality of NAND strings while each of the plurality of NAND strings has a separate drain contact plug that is not shared with any other NAND string of the plurality of NAND strings. The plurality of discrete contact plugs and the plurality of drain contact plugs may have the same shape and the same dimensions.

An example of a method of forming a NAND flash memory array on a substrate includes: forming a plurality of NAND strings that extend along a surface of the substrate in a first direction and are spaced apart along the surface of the substrate in a second direction that is perpendicular to the first direction; forming an electrically conductive area in the substrate, the electrically conductive area extending along the second direction to connect first ends of the plurality of NAND strings; and forming a plurality of discrete vertical connections to the electrically conductive area, the plurality of discrete vertical connections separated from each other by dielectric.

The plurality of discrete vertical connections may be aligned with first ends of alternate NAND strings. Forming the plurality of discrete vertical connections may include: forming oval shaped openings that are elongated along the first direction and are aligned with the electrically conductive area; and filling the oval shaped openings with metal. A plurality of shallow trench isolation (STI) structures may extend along the first direction between the plurality of NAND strings. A plurality of drain connections may connect to second ends of the plurality of NAND strings, each of the plurality of NAND strings having an individual drain connection. The plurality of discrete vertical connections and the plurality of drain connections may be formed by the same process steps and have the same shape and the same dimensions.

An example of a method of forming a NAND flash memory array on a substrate includes: forming a plurality of NAND strings that extend along a surface of the substrate in a first direction and are spaced apart along the surface of the substrate in a second direction that is perpendicular to the first direction; forming a plurality of shallow trench isolation (STI) structures extending in the first direction between the plurality of NAND strings; forming an electrically conductive area in the substrate, the electrically conductive area extending along the second direction to connect source ends of the plurality of NAND strings; forming a plurality of drain contact plugs that contact drain ends of the plurality of NAND strings, the plurality of drain contact plugs spaced apart in the second direction with a first spacing that is the same as spacing of the plurality of NAND strings; and forming a plurality of source contact plugs that contact the electrically conductive area, the plurality of contact plugs spaced apart with a second spacing that is larger than the first spacing.

The spacing of the plurality of NAND strings may be determined by a sidewall spacer process that forms sidewall spacers with dimensions that are smaller than a minimum feature size of a photolithographic process that is used to pattern the substrate. The plurality of drain contact plugs and the plurality of source contact plugs may be formed by filling a pattern of drain contact holes and source contact holes with a metal, the drain contact holes and source contact holes formed by etching through a common mask layer that has identical holes for drain contact holes and source contact holes.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.
FIG. 2A is a plan view of a prior art NAND array.
FIG. 2B shows a cross section of a NAND string of FIG. 2A.
FIG. 4 shows an example of an opening used to define a trench for source line formation.
FIGS. 5A-C illustrate an example of an opening that alternates between wide and narrow, and the profiles formed by anisotropic etching through the opening.
FIGS. 10A-B illustrate a NAND flash memory at an intermediate stage of fabrication.
FIGS. 11A-B illustrate the NAND flash memory of FIGS. 10A-B after deposition of a liner layer.

FIGS. 16A-C show an example of a NAND flash memory at an intermediate stage of fabrication after formation of sidewall spacers on sides of mandrels.
FIGS. 17A-C show the NAND flash memory of FIGS. 16A-C after formation of a cover portion.
FIGS. 18A-C show the NAND flash memory of FIGS. 17A-C after removal of mandrels.
FIGS. 19A-C show the NAND flash memory of FIGS. 18A-C after pattern transfer.
FIGS. 20A-C show the NAND flash memory of FIGS. 19A-C after slimming and formation of (lower) sidewall spacers.
FIGS. 21A-C show the NAND flash memory of FIGS. 20A-C after formation of a (lower) cover portion.
FIGS. 27A-C show an example of a NAND flash memory at an intermediate stage of fabrication.
FIGS. 28A-C show the NAND flash memory of FIGS. 27A-C after formation of a patterned portion of photoresist.
FIGS. 29A-C show the NAND flash memory of FIGS. 28A-C after etching.

DETAILED DESCRIPTION OF EXEMPLARY EMBODIMENTS

Memory System

Figure 2C:
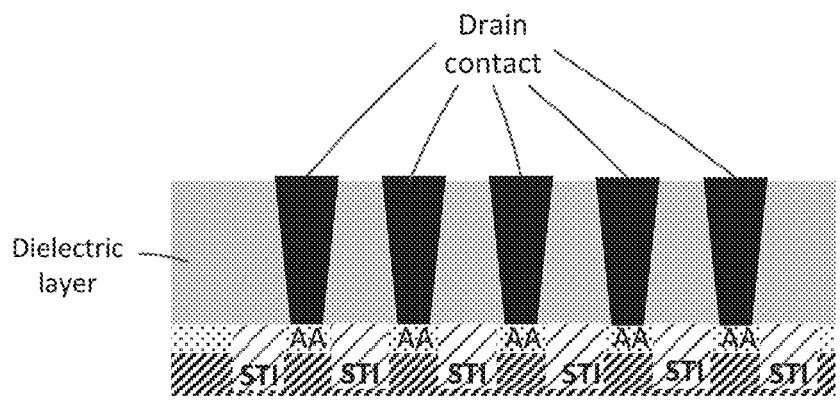
FIG. 2C is a cross section of drain contacts of FIG. 2A.
Figure 2D:
FIG. 2D is a cross section of a common source line of FIG. 2A.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

FIGS. 2A-2D show different views of a prior art NAND flash memory. In particular, FIG. 2A shows a plan view of a portion of such a memory array including bit lines (BL0-BL4) and word lines (this is a simplified structure with a small number of word lines and bit lines). FIG. 2B shows a cross section along A-A' (i.e. along a NAND string) showing individual memory cells that are connected in series with select transistors at each end of the NAND string. Source and drain contacts connect the NAND string shown as part of a larger memory array. In this example, the drain contact connects the drain side of the NAND string to a global bit line (not shown) that runs parallel to the NAND string at a higher metal level. The source contact connects the source side of the NAND string to a common source line that extends in a direction that is perpendicular to the NAND string (i.e. parallel to the word lines).

FIG. 2C shows a cross section along C-C' of FIG. 2A. Contacts extend up from active areas ("AA") in the substrate where the contacts make electrical contact with the doped active areas in what may be considered a drain contact areas of the NAND strings. Each of the drain contacts shown is electrically isolated from neighboring drain contacts by a dielectric layer. Global bit lines may be formed over and aligned with the contacts shown so that each NAND string is connected to a different global bit line. Thus, each of the NAND strings may have a different bias applied to its drain to allow selective accessing of cells of different NAND strings (e.g. selective programming of memory cells of some NAND strings while others are inhibited). NAND string, including their contact areas, are isolated from each other by STI structures that extend along the bit line direction between neighboring NAND strings.

In contrast to the individual contacts connecting drain ends of the NAND strings, a common contact is formed to the drain ends of the NAND strings. A conductive line extends along the cross section of FIG. 2D (cross section along D-D') and forms an electrical connection to contact areas of NAND strings (active areas, "AA"). The conductive line also extends across STI structures between NAND strings and lies in contact with STI structures.

A common source line may be formed by etching a trench that exposes source contact areas and subsequently filling the trench with metal. Such a trench is etched to a sufficient depth to expose contact areas and may also expose STI structures. However, there may be undesirable consequences from exposing such STI structures and depositing metal on them.

Figure 3A:
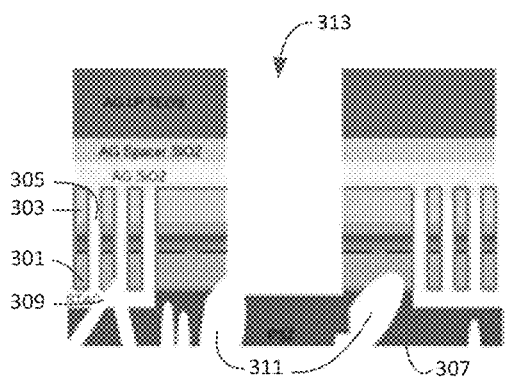
FIGS. 3A-D illustrate penetration of wet etchant through exposed STI material.

FIGS. 3A-D illustrate an example of problems related to exposure of STI structures. FIG. 3A shows a cross section of a portion of a NAND flash memory array at an intermediate stage of fabrication. FIG. 3A shows floating gates (e.g. floating gate 301) and word lines (e.g. word line 303) in cross section with air gaps (e.g. air gap 305) between neighboring word lines and floating gates. FIG. 3A also shows an STI structure 307 that is formed of polysilazane (PSZ). An air gap 309 extends over the STI structure 307, along the bit line direction, to isolate adjacent floating gates in the word line direction. Air gaps extending along the word line direction between word lines and floating gates (e.g. air gap 305) and air gaps extending along the bit line direction between floating gates (e.g. air gap 309) may not be isolated from each other so that air, or other gas or fluid, may travel between such air gaps.

STI structure 307 has voids (e.g. voids 311) formed in it and some of the voids extend to the air gaps (e.g. to air gap 309). FIG. 3A also shows a trench 313 that is etched where source contacts are to be formed. Forming a trench may expose some of the voids in the STI material between NAND strings and this may allow etchant to enter voids and expand voids (i.e. etching may extend beyond the trench because etchant progresses into STI along voids and then expands the voids by etching the PSZ).

Figure 3B:
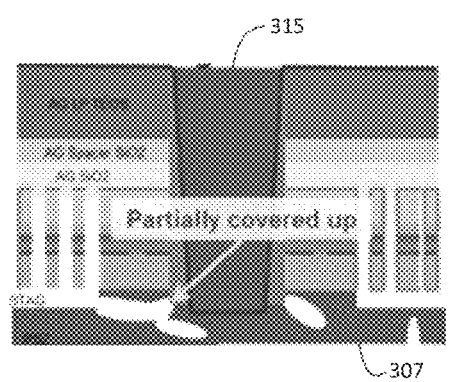

FIG. 3B shows the structure of FIG. 3A after deposition of dielectric 315 in the trench, for example by depositing layers of dielectric material and subsequently planarizing, e.g. using Chemical Mechanical Polishing (CMP), to remove excess dielectric material. Such deposition covers exposed conductive material (e.g. floating gate layer and control gate layer portions that later form select lines) and also may partially cover up voids in STI structure 307, e.g. at location marked "Partially covered up".

Figure 3C:
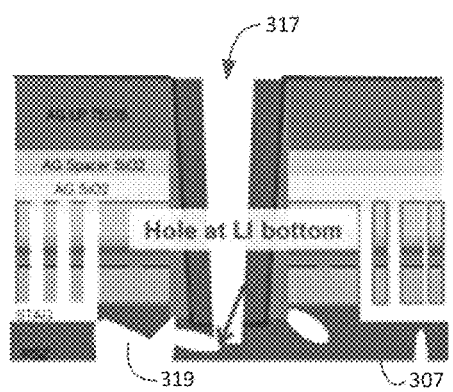

FIG. 3C shows the structure of FIG. 3B after formation of a trench 317 within dielectric 315 (e.g. by anisotropic etching such as by RIE) to expose contact areas (not shown in the cross section of FIG. 3C because the plane of FIG. 3C is along the STI, not active area). The trench extends into the STI structure 307 and exposes a void 319 at the location indicated "Hole at LI bottom."

Figure 3D:
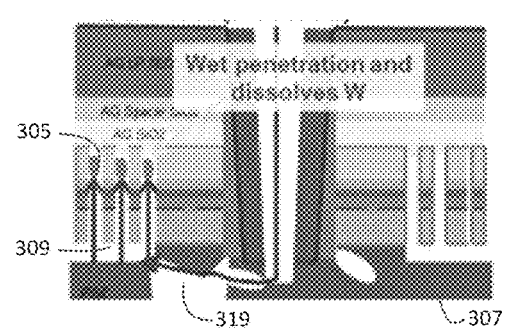

FIG. 3D illustrates how a subsequent wet etch may penetrate into STI structure 307 along voids such as void 319 and may continue into air gaps that separate floating gates and word lines (e.g. air gap 305). When wet etchant enters such air gaps it may travel extensively along connected air gaps (along pathway indicated by arrows) and may damage sensitive floating gate and word line structures. For example, tungsten (W) that is used to form word lines may be attacked and dissolved by etchant which may cause one or more word lines to be inoperable, which may in turn cause a block to be unusable. Such damage may be seen as a "black haze" that affects the appearance of a die.

In order to ensure good contact between metal of a common source line and source contact areas of NAND strings, some over-etching may be performed to ensure that there is no material between the contact and the contact area. Such over-etching may tend to produce a trench extending into STI structures as shown so that exposure of voids is likely to occur at some locations. Wet etching to clean etched surfaces may cause penetration through such exposed voids and may result in damage as illustrated.

FIG. 4 shows a top-down view of a substrate with an opening 421 to form a trench as shown in FIG. 3C, i.e. an elongated opening that is formed in a resist layer 423 to define a trench when anisotropic etching is performed. The elongated opening 421 has a uniform width (W) and extends over and exposes both active areas ("AA") and STI structures ("STI") in the substrate.

In contrast, FIG. 5A shows a top-down view of a different opening 527 that is used to form a trench with variable depth. It can be seen that the width of the opening varies from a first width ("W1") over active areas to a smaller second width ("W2") over STI structures. Thus, the opposing sides of the opening can be seen to have a zig-zag profile with alternating protrusions (over STI structures) and indentations (over active areas). When such an opening is used to define a trench during anisotropic etching, the alternating widths produce different trench profiles at different locations.

The results of alternating the widths of the opening between wider and narrower dimensions may be seen at two locations in FIGS. 5B and 5C which show cross sections at a contact area of a NAND string (FIG. 5B) and along an STI structure between NAND strings (FIG. 5C).

FIG. 5B shows trench 529 at a point where the opening is wider over a contact area. Trench 529 extends down to the substrate 531 to expose the active area (AA) and thus allow a common source line that is subsequently formed in the trench to contact the NAND string. Some over-etching may be performed so that the trench extends deeper than the upper surface of the substrate 531 at this location. Wet etching may be performed after anisotropic dry etching.

In contrast, FIG. 5C shows trench 529 at a point where the narrower opening over an STI structure 533 results in shallower etching. In general, a wider opening provides higher etch rate and deeper etching during anisotropic etching than a narrower opening does, according to what may be referred to as "microloading effect." The depth of trench 529 at the location of FIG. 5C is significantly less than shown in FIG. 5B so that trench 529 does not extend to the level of the upper surface of substrate 531 at this location. Instead, significant dielectric material 535 remains between the trench and the underlying STI structure so that there is no pathway for etchant to enter voids in STI structure 533, and thus no pathway for etchant to penetrate into air gaps and attack word lines or floating gates.

It will be understood that the two cross sections of FIGS. 5B and 5C are representative of the trench profile at contact areas and STI structures respectively so that the trench alternates from being wider and therefore deeper over contact areas to being narrower and therefore shallower over STI structures. This ensures that good contact is made with contact areas in the substrate without exposing STI structures to etching at this stage.

Figure 6A:
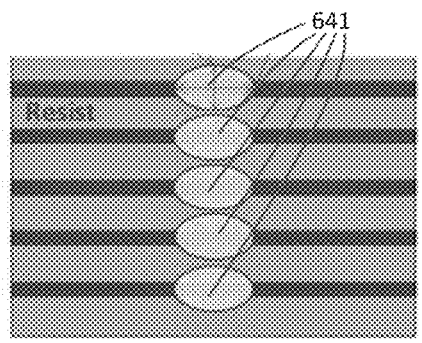
FIGS. 6A-B illustrate an example of merging isolated openings to form an elongated opening of varying width.
Figure 6B:
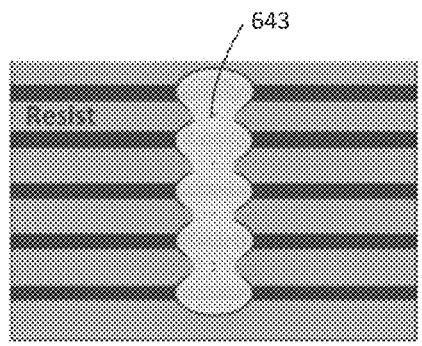

An opening that varies between wide and narrow dimensions may be formed in any suitable manner. FIGS. 6A-B illustrate one way that such an opening may be formed. Initially, a row of isolated openings 641 are defined, for example, using a photo mask (reticle) that has a pattern as shown in FIG. 6A and then isolated openings are merged into a single opening 643 (e.g. by wet etching). Alternatively, exposure may be extended to over dose the exposed resist and cause the exposed areas to merge so that a single elongated opening is formed.

Figure 7:
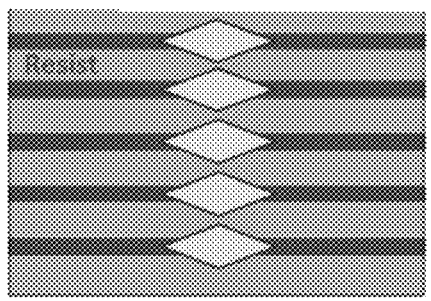
FIG. 7 illustrates a pattern of rhomboid openings.

The shape of individual openings defined by a photo mask may be oval-shaped as shown in FIG. 6A or may be any other suitable shape. FIG. 7 shows an example where the individual openings are diamond-shaped (rhombus) in top-down view. Subsequent processing may expand individual openings to form an elongated opening that alternates between wide and narrow dimensions.

Figure 8:
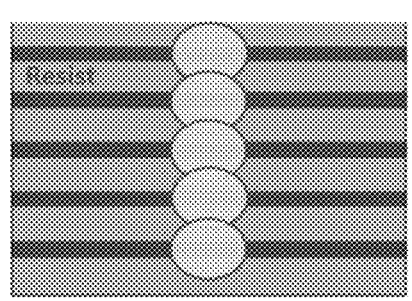
FIG. 8 illustrates a pattern of overlapping openings.

FIG. 8 shows an example in which an extended opening is defined by a pattern of partially overlapping circular openings. No overexposure may be required in this example because the overlapping pattern in the photo mask results in a single elongated opening without requiring over dosing.

Figure 9:
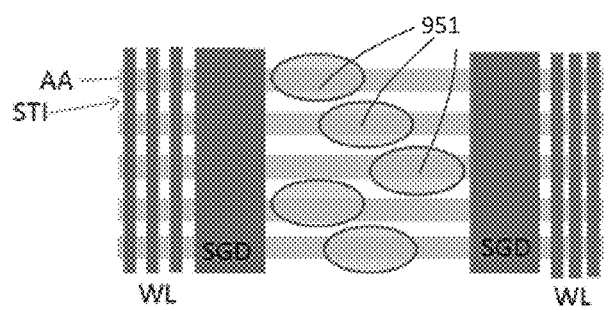
FIG. 9 illustrates isolated openings defining isolated drain contacts.

It may be efficient to form an opening that defines a common source line in the same patterning step that forms other openings, such as openings that define electrically-separate drain contacts as shown in FIG. 2C. FIG. 9 shows an example of a pattern of openings that define drain contacts over contact areas at the drain ends of NAND strings that are separated by STI structures ("STI"). In order to avoid merging of openings 951, these openings are offset, or staggered, along the bit line direction so that they remain isolated (i.e. no merging of openings 951 occurs because they are staggered). While, openings are aligned in a straight line at the source end of such NAND strings and merge into a single opening, openings are staggered at the drain end of the NAND strings to ensure that they remain isolated and do not merge. Individual openings may be the same at either end, e.g. having the same shape and dimensions (or may be different). In this way, the same patterning step may be used to define a trench of alternating width at the source end and to define isolated holes at the drain end. When filled with metal, these form a common source line and separate, electrically isolated, drain contacts respectively. While the pattern of FIG. 9 shows a pattern that repeats every three contacts (a "triple stepped" pattern), other patterns may also be used (e.g. every other contact may be stepped, or pattern may repeat every four, five, or more contacts).

FIGS. 10A-B show cross sections of a trench at an intermediate stage of fabrication of a NAND flash memory. Specifically, FIG. 10A shows a cross section at a source contact area (active area, AA) where the trench is wider and where etching extends down close to the substrate 153. In this example, an etch stop layer 155, for example a layer of silicon nitride (SiN), is used so that anisotropic etching stops at this point, before exposing the active area. FIG. 10B shows a cross section of the trench over an STI structure 157. At this location the trench is narrower so that anisotropic etching has not reached the etch stop layer 155.

FIGS. 11A-B show the trench of FIGS. 10A-B at the same locations at a subsequent stage of fabrication. At this stage a liner layer 159, for example a layer of silicon oxide, is deposited. The liner layer extends along surfaces of the trench. At the wider trench location of FIG. 11A the liner layer deposits along side surfaces and the bottom surface of the trench. At the narrower trench location of FIG. 11B, the trench is sufficiently narrow towards the bottom that liner layer deposited on sidewalls fills the lower part of the trench at this point, i.e. the trench may be filled where the width of the trench is less than twice the thickness of the liner layer so that the vertical thickness of the liner layer material at this location may be significantly greater than the thickness of the liner layer.

Figures 12A, 12B:
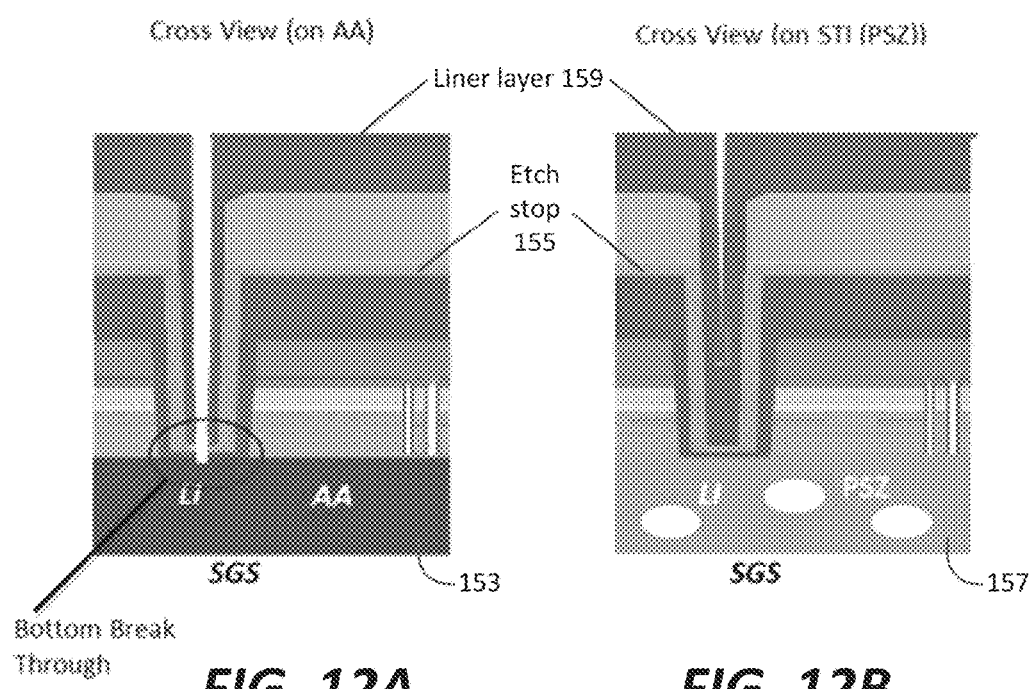
FIGS. 12A-B illustrate the NAND flash memory of FIGS. 12A-B after etching through the liner layer over contact areas.

FIGS. 12A-B show the trench of FIGS. 11A-B at the same locations at a subsequent stage of fabrication. An additional anisotropic etch step is used to break through the liner layer at the bottom of the trench at the wider location of FIG. 12A ("Bottom break through"). Etching then extends the trench at this location until the contact area is exposed. In contrast, no such break through occurs at the narrower location of FIG. 12B because of microloading and the greater vertical height of liner layer at this location (in addition to greater amount of other dielectric material under the liner layer). Wet etching can safely be performed at this stage without exposing any STI voids to wet etch. Voids in the STI structure 157 are isolated from exposure to wet etch by the dielectric that remains over the PSZ including the etch stop layer 155, liner layer 159 and any other overlying dielectrics.

Figure 13:
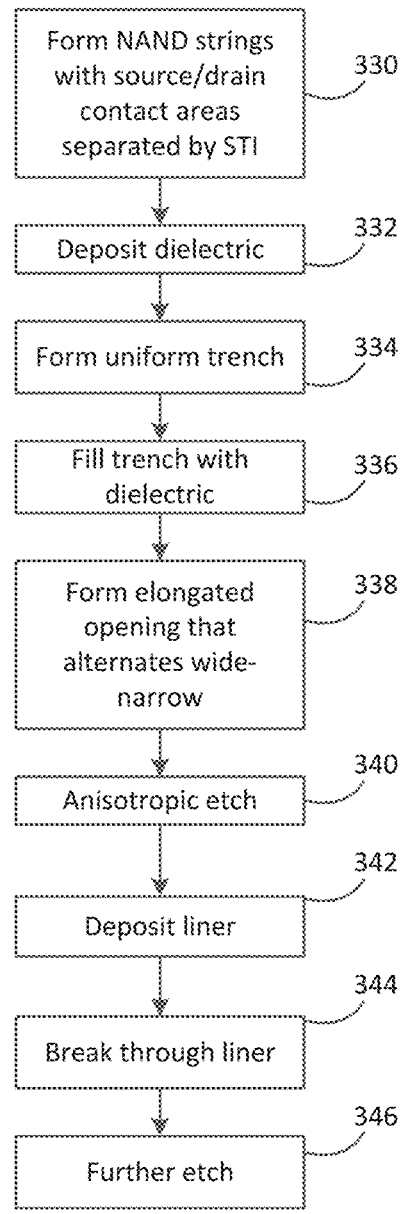
FIG. 13 shows an example of process steps used to form a NAND flash memory.

FIG. 13 shows an example of steps that may be used to form contacts in a NAND flash memory. NAND strings with source and drain contact areas, separated by STI structures, are formed 330 in a substrate using any suitable process. Subsequently, one or more dielectrics are deposited 332 to form a dielectric layer over the NAND strings. Anisotropic etching is then used to form a uniform trench 334, in this case, a trench of uniform width that extends perpendicular to the NAND strings. The trench is then filled 336 with dielectric (e.g. by depositing one or more dielectric materials that may include an etch-stop layer). Subsequently, patterning is used to form elongated openings 338 that alternate from wide to narrow, for example, in a resist layer and etch mask layer. Anisotropic etching 340 is then performed using the opening to define a trench. Etching tends to extend deeper where the trench is wider. Etching may stop at an appropriate point, for example, using an etch-stop layer to stop before the contact areas are exposed. Subsequently, a liner layer is formed 342 in the trench. A subsequent etch step is used to break through the liner 344 at locations where the trench is wider while the liner remains at locations where the trench is narrower. Further etching 346 may then extend the trench where the break through occurred, over the contact areas, without significantly affecting areas where no breakthrough occurred, e.g. by using selective etching. Wet etching may be used at this point without significant risk of etchant penetrating through STI material.

Source Connection in Substrate

NAND strings may be connected together by a common metal line (common source line) as described above. Another way to connect NAND strings is to form an electrically conductive area in a substrate that extends along terminals of NAND strings and thereby connects them together. Such a conductive area may be contacted by discrete contact plugs (or a continuous metal line) so that an appropriate connection may be made to peripheral circuits (e.g. a common source line).

Figure 14A:
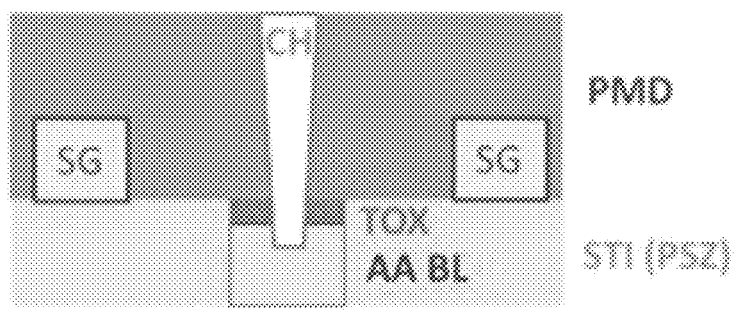
FIGS. 14A-B show a conductive portion in a substrate connecting source terminals of NAND strings.
Figure 14B:
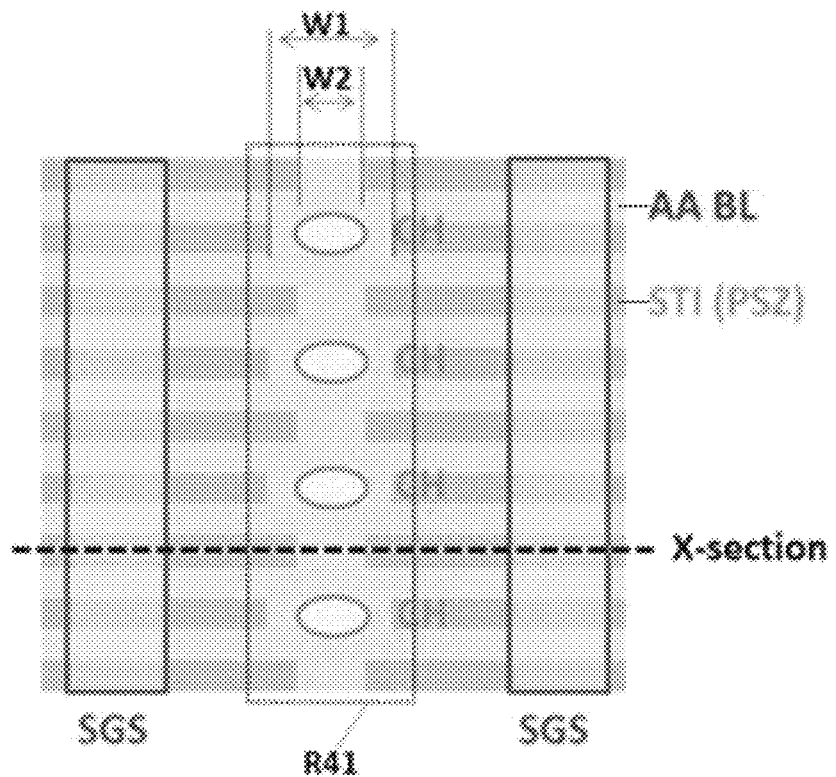

FIGS. 14A-B illustrate an example of a conductive area R41 that extends in a direction that is perpendicular to NAND strings (i.e. parallel to word lines and select lines). FIG. 14B shows a top view of the conductive area R41 with select lines (SGS) extending in parallel on either side. It can be seen that active areas of individual bit lines (AA BL) where NAND strings are formed extend in a direction perpendicular to the conductive area (i.e. extend horizontally in FIG. 14B) and connect with the conductive area. The conductive area may be made conductive by implantation of ions. This may be done in the same implantation step that forms source/drain areas between memory cells and that forms contact areas at ends of NAND strings. Thus, rather than form physically separate contact areas for NAND strings, the conductive area connects terminals of NAND strings together so that NAND strings do not require individual contact areas.

FIG. 14B shows STI structures on either side of conductive area R41. While some previous arrangements had STI structures extending through areas where contacts are formed, STI structures of FIG. 14B end on either side of conductive area R41. It can be seen that STI structures have differing lengths so that the conductive area varies in width. At some locations, between longer STI structures, conductive area R41 has a width of W2 while at other locations between shorter STI structures, conductive area R41 has a width of W1, which is greater than W2. Such variation in width may facilitate discrete contact areas that are contacted by discrete contact plugs. In FIG. 14B, contact areas and contact plugs are located between shorter STI structures, where conductive area R41 is relatively wide. These wider areas allow relatively large contact areas and provide a good margin for alignment errors.

Figure 15A:
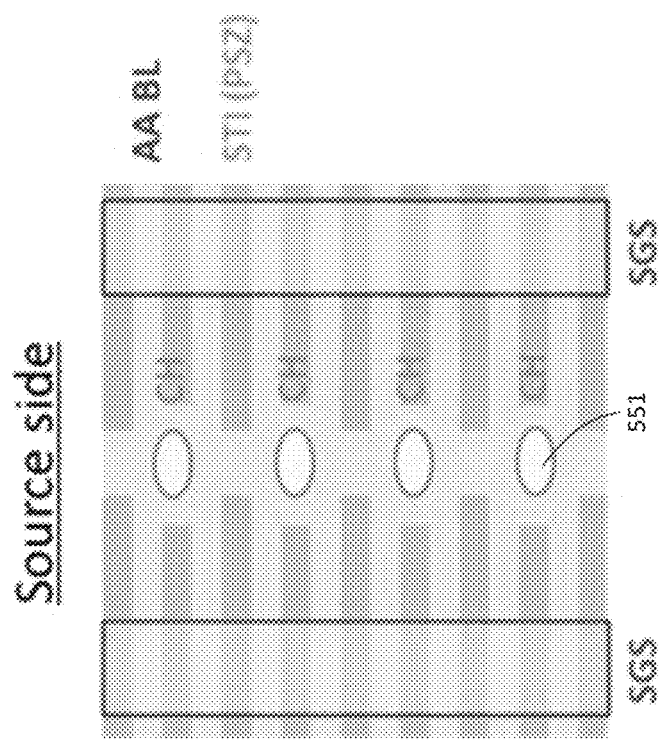
FIGS. 15A-B show drain and source contact holes respectively in a NAND memory.
Figure 15B:
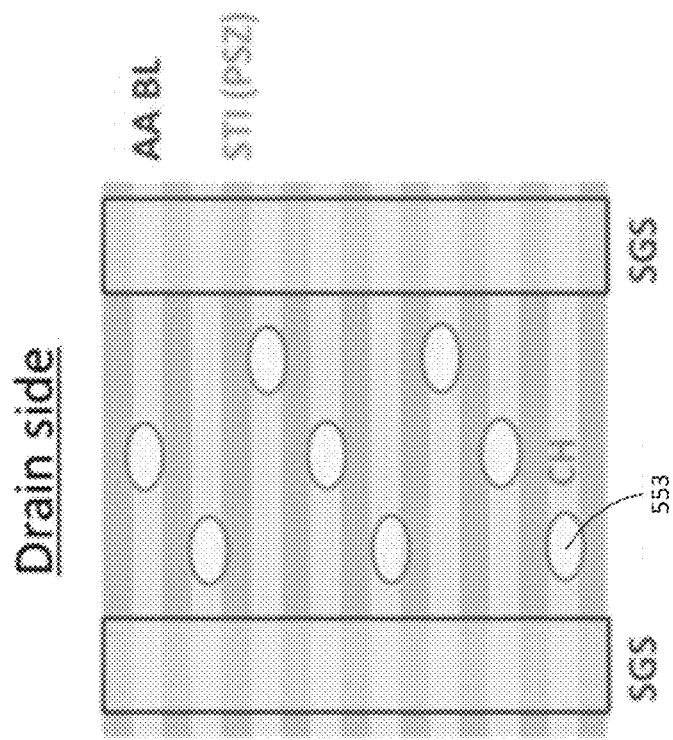

One concern when forming source and drain contacts is whether a single etch step can form both source and drain contact holes. Where a continuous metal line is formed by etching a trench at the source side, it may be difficult to etch such a trench and etch discrete openings on the drain side (e.g. microloading effect may result in a higher etch rate in the trench so that overetching occurs at the source side or underetching occurs at the drain side). FIGS. 15A and 15B illustrate similar contact holes ("CH") formed on both the drain side and source side respectively. The holes may be identical, or near identical. The holes may have the same shape and orientation (in this case, an oval shape that is elongated along the bit line direction). The holes may have the same dimensions. While the discrete contact holes of FIG. 15B (e.g. contact hole 551) may result in higher resistance than a continuous metal line, the conductive area provides electrical connection along the common source line. It will be understood that the discrete contacts on the source side connect to an overlying common source line (e.g. metal line extending in the word line direction) while contacts on the drain side (e.g. contact hole 553) connect to overlying bit lines that extend along the bit line direction (perpendicular to the word line direction). Drain side contact holes of FIG. 15A are offset along the bit line direction to provide sufficient spacing to prevent leakage or shorting. Source contact holes are not offset (in a straight line in this example) because the contact plugs formed in source contact holes are electrically connected together in the substrate and above.

In some cases the contact holes and resulting contact plugs may physically contact at some higher level so that even though contact areas at the substrate surface are discrete and isolated from each other, contact holes may merge at some higher level so that a continuous metal conductor is formed when contact holes are filled. For example, contact holes may be widened as described above so that source side contact holes that are discrete at the substrate surface level become a continuous elongated opening at a higher level.

Drain contact holes may have larger spacing (by being offset) so that they do not merge and remain electrically isolated.

The structures of FIGS. 14-15 may be formed in any suitable manner. An example of a process for forming such structures is illustrated in FIGS. 16-26.

FIGS. 16A-C show a portion of a memory array at an intermediate stage of fabrication in three different views. FIG. 16A shows a cross section at a location where contacts are to be formed to NAND strings (in this case source contacts to source ends of NAND strings). FIG. 16B shows a cross section at a location where memory cells of NAND strings are to be formed. Both FIGS. 16A and 16B are cross sections along the word line direction (i.e. perpendicular to the bit line direction) as illustrated in the top view of FIG. 16C, which shows location (1) corresponding to FIG. 16A and location (2) corresponding to FIG. 16B. Subsequent figures show corresponding perspectives at subsequent stages, i.e. FIGS. 17A, 18A, 19A, etc. show the same perspective as FIG. 16A at subsequent stages while FIGS. 17B, 1813, 19B, etc. show the same perspective as FIG. 16B at subsequent stages.

FIG. 16A shows a silicon substrate 661 with a tunnel dielectric 663 (e.g. silicon oxide) and floating gate layer 665 (e.g. doped polysilicon). A mask layer 667 overlies the floating gate layer and a lower mandrel layer 669 (not patterned at this stage) overlies mask layer 667. On the upper surface of the lower mandrel layer 669, mandrels 671a-b extend in the bit line direction (perpendicular to the cross section shown). Sidewall spacers 673a-d extend along sides of the mandrels 671a-b. The cross section of FIG. 16B is similar to that of FIG. 16A at this stage with the same pattern of mandrels and sidewall spacers extending over the substrate. FIG. 16C shows a top view with mandrels extending along the bit line direction.

FIGS. 17A-C show the substrate after formation of a cover portion 675 (formed of photoresist in this example) at a location where contacts are subsequently to be formed, i.e. at a location where ends of NAND strings are to be connected to a common source line.

FIG. 17A shows cover portion 675 in cross section extending along the word line direction across the mandrels and sidewall spacers. In contrast, no photoresist covers the mandrels at the location of FIG. 17B. This is illustrated in FIG. 17 C, which shows photoresist portion 675 at location (1) and not at location (2).

FIG. 18A show the substrate after an etch step to remove mandrels 671a-b. While the photoresist portion 675 covers mandrels at the location shown in FIG. 18A, mandrels 671a-b are removed at the location shown in FIG. 1813, leaving the sidewall spacers 673a-d on the surface of the lower mandrel layer 669.

FIGS. 19A-C show the substrate after another etch step that transfers the pattern of sidewall spacers 673a-d to the lower mask layer 669. At the location illustrated in FIG. 19A, the lower mandrel material remains because it was covered by photoresist during etching. At the location illustrated in FIG. 19B a series of mandrels 669a-d are formed at locations where sidewall spacers 673a-d were located. Thus, the four sidewall spacer result in four mandrels (compared with just two mandrels in the upper mandrel layer). FIG. 19C illustrates the remaining lower mandrel material, which forms mandrels 669a-d extending in the bit line direction with a portion of mandrel material in region R3 extending along the bit line direction where photoresist covered the lower mandrel layer during etching.

FIGS. 20A-C show the substrate after slimming of mandrels 669a-d and formation of sidewall spacers (e.g. spacer 677). Mandrels may be slimmed using an appropriate isotropic etch (e.g. wet etch). Sidewall spacers are then formed by depositing a blanket layer and performing anisotropic etching (e.g. Reactive Ion Etching, RIE) to leave sidewall spacers as shown.

FIGS. 21A-C show the substrate after a second photoresist portion 679 is formed over the contact area. Second photoresist portion 679 extends along the cross section of FIG. 21A, while no photoresist extends at the location illustrated in FIG. 2113. FIG. 21C shows the width of second photoresist portion 679 as W12, which is wider than the first photoresist portion W11.

Figure 22A:
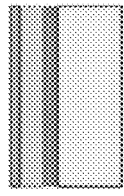
FIGS. 22A-C show the NAND flash memory of FIGS. 21A-C after mandrel removal.
Figure 22B:
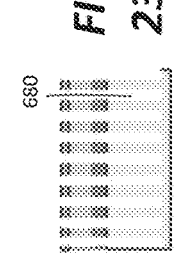
Figure 22C:
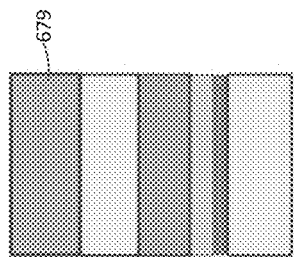

FIGS. 22A-C show the substrate after lower mandrels 669a-d are removed. For example, a selective etch may be used to remove mandrels while leaving lower spacers intact. Eight lower spacers remain on the mask layer at this point. Thus, from the two upper mandrels that were formed by direct photolithographic patterning, four lower mandrels were formed, and eight lower spacers are formed from them.

Figure 23A:
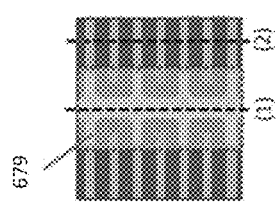
FIGS. 23A-C show the NAND flash memory of FIGS. 22A-C after etching to form STI structures in the substrate.
Figure 23B:
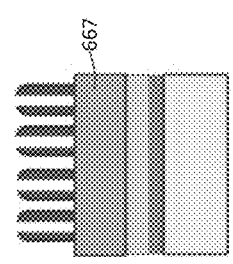
Figure 23C:
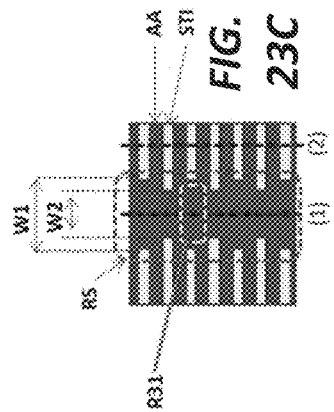

FIGS. 23A-C show the substrate after patterning. An etch may first transfer the pattern of lower spacers and the second photoresist portion to the mask layer 667. The patterned mask layer may then be used as a hard mask during etching of the underlying floating gate layer and substrate. Etching into the substrate forms trenches, which are later filled to form STI structures 680. Because the locations of STI structures are established by two different openings (openings where lower mandrels were removed, and openings between sidewalls of neighboring mandrels) there are two different types of STI structures in this example. Lower mandrels 669a-d are removed while second photoresist portions cover the contact area so that lower mandrels remain in the area of second photoresist portion. Thus, STI structures formed where lower mandrels are removed end where second photoresist covered the mandrels and maintained them. Because second photoresist portion had a width W1, these STI structures are a distance W1 apart. In contrast, STI structures formed between sidewalls of neighboring mandrels extend further and are separated by distance W2.

Figure 25:
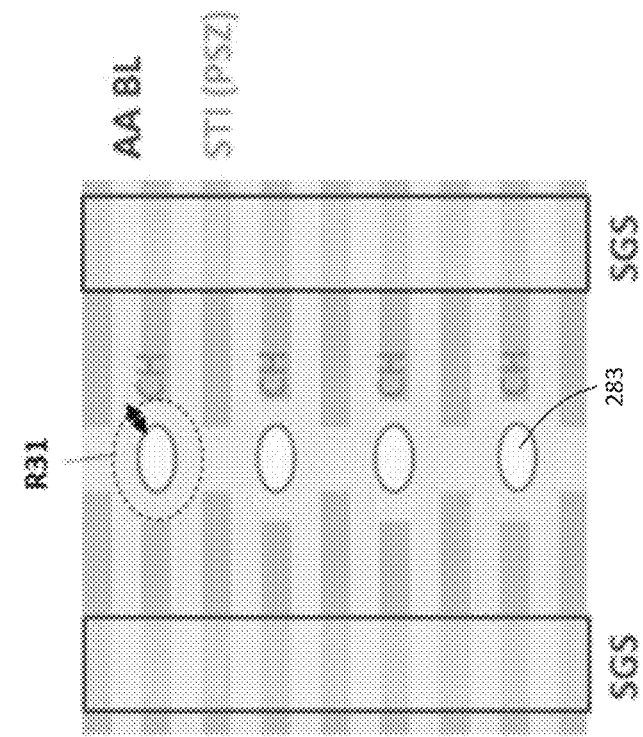
FIG. 25 shows a series of discrete contact plugs contacting a conductive area of a substrate.
Figure 24:
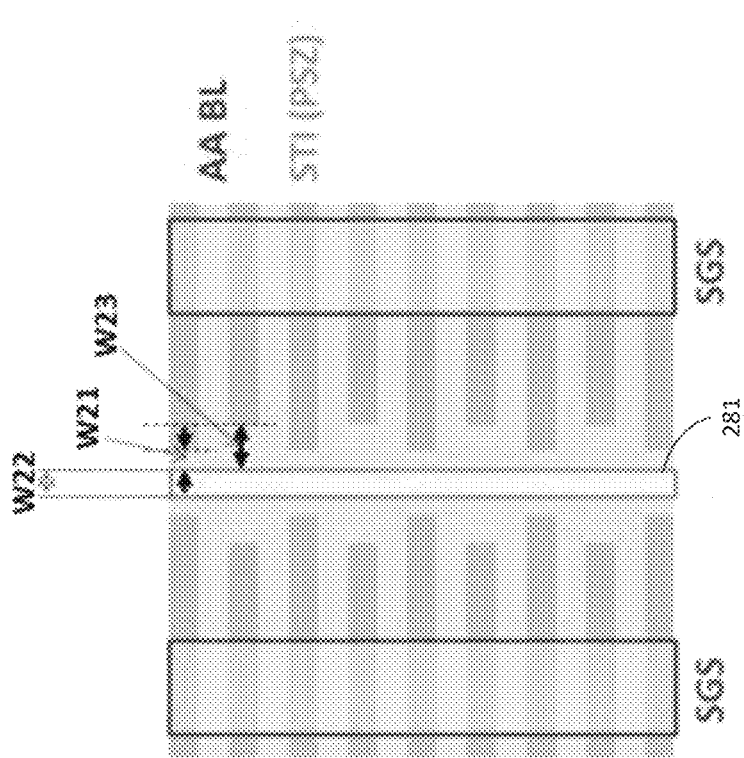
FIG. 24 shows a common source line in continuous contact with a conductive area of the substrate.

FIGS. 24 and 25 illustrate a continuous source line 281 and a series of discrete contact plugs (e.g. contact plugs 283) respectively. Both examples show a similar continuous conductive area in a substrate so that source terminals of NAND strings are connected together in the substrate. In FIG. 24, it can be seen that source line width W22 is limited by longer STI structures. In particular, where STI structures are longer, some minimum spacing W21 must be maintained between source line 281 and STI structures to allow for misalignment and to ensure that etching does not penetrate STI structures. This results in a larger spacing W23 between source line 281 and shorter STI regions. Such additional spacing may be considered wasted because W21 is sufficient and the additional width does not provide a direct benefit.

In contrast, FIG. 25 shows how the varying spacing facilitates discrete contact areas that may be relatively large while maintaining some required minimum distance from STI structures (e.g. R31 in FIG. 25). It can be seen that available space along the conductive area is efficiently used in this example. This provides a large contact area between metal contact plugs and the conductive area which reduces contact resistance accordingly. The oval shape of contact areas can be seen to efficiently use the available space while maintaining a minimum offset from any STI structure. Different shapes and orientations may be appropriate where STI geometry is different. While the example of FIG. 25 shows alternating shorter/longer STI structures with contact areas located between shorter STI structures (i.e. contact areas between alternate STI structures), other arrangements may be implemented.

Figure 26:
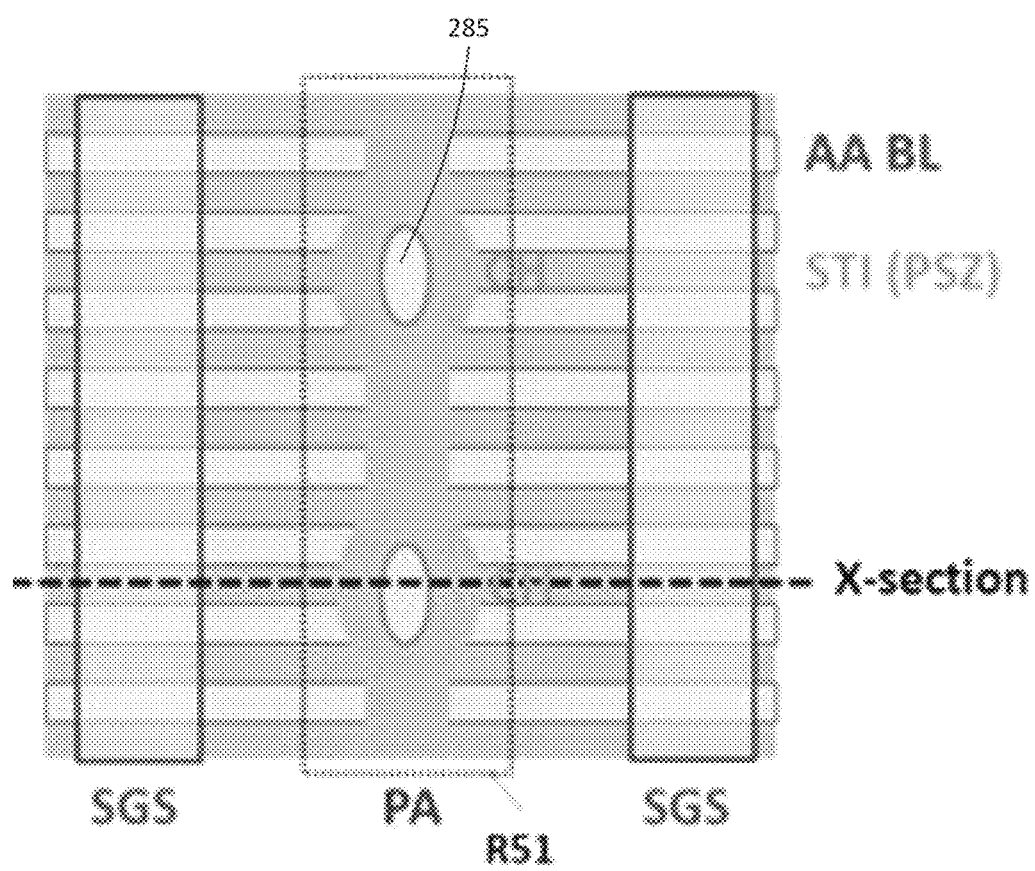
FIG. 26 shows another example of contact plugs contacting a conductive area of a substrate.

FIG. 26 shows another example with different contact area (contact plug) geometry that is adapted to different STI geometry. In this example, contact areas (e.g. contact area 285) and contact plugs have an oval shape that is elongated along the word line direction (i.e. elongated along a direction that is perpendicular to the STI structures). Contact areas are aligned with active areas so that the center of a contact area is directly between two NAND strings. Contact areas are located every four NAND strings and the shape of the conductive portion is wider at corresponding locations to provide sufficient alignment margin while maintaining sufficient contact area.

FIGS. 27-29 illustrate an example of a process for forming a structure like that shown in FIG. 26. FIGS. 27A-C illustrate a substrate after lower spacers (Lw spacers) are formed by a Sidewall Assisted Process (SAP), i.e. at a stage where lower spacers extend across the entire area shown in a pattern corresponding to FIG. 22B. A stack of mask layers (AA mask a-Si, AA Mask BSG, and AA Pad SiN) extend over the floating gate (FG) and tunnel oxide (TOX) layers in this example. While FIG. 27A shows a cross section along the bit line direction at a location (location (1) in FIG. 27C) where a lower spacer is present, FIG. 27B shows a cross section at a location (location (2) in FIG. 27C) where no lower spacer is present.

FIGS. 28A-C illustrate the substrate after formation of a photoresist portion 891 that extends over the lower spacers and is used to define a conductive area in the substrate. It can be seen that the photoresist portion 891 is wider at a location where a contact area is to be located so that the contact area can be of sufficient size while maintaining a required distance from any STI structure.

FIGS. 29A-C show the substrate after etching. An initial etch may transfer the pattern of lower spacers and the photoresist portion 891 to one or more underlying mask layers. Mask layers are then used as an etch mask during etching of the underlying floating gate, tunnel oxide, and substrate. In particular, etching extends to form trenches in the substrate which are subsequently filled with a suitable dielectric (e.g. PSZ) to form STI structures. The shape of photoresist area is replicated in the substrate with STI trenches on either side at locations that were not covered by lower spacers or the photoresist portion.

Figure 30:
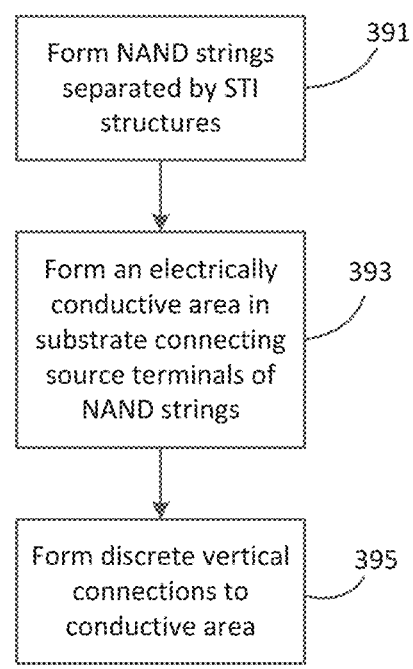
FIG. 30 shows an example of steps used in forming a NAND flash memory.

FIG. 30 shows an example of process steps used in forming a NAND flash memory and particularly in forming connections in such memories. NAND strings are formed in a substrate 391 with STI structures separating each NAND string from neighboring NAND strings (i.e. active areas of NAND strings are separated by STI structures that extend parallel to the NAND strings). An electrically conductive area is formed in the substrate so that source terminals of NAND strings are connected together in the substrate 393. STI structures may terminate so that active areas of NAND strings can be connected together in the substrate by appropriately doping a portion of the substrate that extends perpendicular to the NAND string and the STI structures. Subsequently, discrete vertical connections to the conductive area are formed 395. This may be done in a manner that efficiently uses the available area of the conductive area while maintaining a safe distance from STI structures to ensure that contact holes do not expose STI structures during etching.

CONCLUSION

Although the various aspects have been described with respect to examples, it will be understood that protection within the full scope of the appended claims is appropriate.

It is claimed:

1. A NAND flash memory comprising:
a plurality of NAND strings formed in a substrate, each of the plurality of NAND strings extending along a first direction between a first terminal and a second terminal;
an electrically conductive area in the substrate, the electrically conductive area having a first side and a second side longer than the first side, the second side of the electrically conductive area extending in parallel with a select line of the NAND flash memory along a second direction that is perpendicular to the first direction, the electrically conductive area electrically connecting first terminals of the plurality of NAND strings;
a plurality of discrete contact areas in the electrically conductive area;
a plurality of discrete contact plugs, each contact plug contacting a corresponding contact area in the electrically conductive area defined by the first side and the second side, each of the plurality of discrete contact plugs located at a first terminal of a corresponding one of a subset of the plurality of NAND strings, none of the plurality of discrete contact plugs located at first terminals of the other subset of the plurality of NAND strings; and
the plurality of discrete contact areas are only located at first terminals of every other NAND string of the plurality of NAND strings, the every other NAND strings of the plurality of NAND strings being the subset of the plurality of NAND strings.

2. The NAND flash memory of claim 1 wherein each of the plurality of contact plugs has an oval shape that is elongated along the first direction.

3. The NAND flash memory of claim 1 further comprising a plurality of shallow trench isolation (STI) structures extending along the first direction between the plurality of NAND strings.

4. The NAND flash memory of claim 3 wherein each of a first subset of the plurality of STI structures has a first length along the first direction and each of a second subset of the plurality of STI structures has a second length along the first direction, the second length longer than the first length, and wherein the plurality of contact areas are aligned with the first subset of the plurality of STI structures.

5. The NAND flash memory of claim 4 wherein one or more of the second subset of the plurality of STI structures extend between two neighboring contact areas of the plurality of discrete contact areas.

6. The NAND flash memory of claim 1 wherein the first terminal is a source terminal and the plurality of discrete contact plugs connect to a common source line.

7. The NAND flash memory of claim 6 wherein the second terminal is a drain terminal, the NAND flash memory further comprising a plurality of drain contact plugs that connect to drain terminals of the plurality of NAND strings.

8. The NAND flash memory of claim 7 wherein each of the plurality of discrete contact plugs is coupled to two or more corresponding NAND strings of the plurality of NAND strings, wherein each of the plurality of NAND strings is coupled to a separate corresponding drain contact plug that is not shared with the other NAND strings of the plurality of NAND strings.

9. The NAND flash memory of claim 7 wherein the plurality of discrete contact plugs and the plurality of drain contact plugs have the same shape and the same dimensions.

10. A NAND flash memory comprising:
a plurality of NAND strings formed in a substrate, each of the plurality of NAND strings extending along a first direction between a first terminal and a second terminal;
an electrically conductive area in the substrate, the electrically conductive area having a first side and a second side longer than the first side, the second side of the electrically conductive area extending in parallel with a select line of the NAND flash memory along a second direction that is perpendicular to the first direction, the electrically conductive area electrically connecting first terminals of the plurality of NAND strings;
a plurality of discrete contact areas in the electrically conductive area;
a plurality of discrete contact plugs, each contact plug contacting a corresponding contact area in the electrically conductive area defined by the first side and the second side, each of the plurality of discrete contact plugs located at a first terminal of a corresponding one of a subset of the plurality of NAND strings, none of the plurality of discrete contact plugs located at first terminals of the other subset of the plurality of NAND strings; and
the plurality of discrete contact areas are only located at first terminals of every fourth NAND string of the plurality of NAND strings, the every fourth NAND strings of the plurality of NAND strings being the subset of the plurality of NAND strings.

11. The NAND flash memory of claim 10 wherein each of the plurality of contact plugs has an oval shape that is elongated along the first direction.

12. The NAND flash memory of claim 10 further comprising a plurality of shallow trench isolation (STI) structures extending along the first direction between the plurality of NAND strings.

13. The NAND flash memory of claim 12 wherein each of a first subset of the plurality of STI structures has a first length along the first direction and each of a second subset of the plurality of STI structures has a second length along the first direction, the second length longer than the first length, and wherein the plurality of contact areas are aligned with the first subset of the plurality of STI structures.

14. The NAND flash memory of claim 13 wherein one or more of the second subset of the plurality of STI structures extend between two neighboring contact areas of the plurality of discrete contact areas.

15. The NAND flash memory of claim 10 wherein the first terminal is a source terminal and the plurality of discrete contact plugs connect to a common source line.

16. The NAND flash memory of claim 15 wherein the second terminal is a drain terminal, the NAND flash memory further comprising a plurality of drain contact plugs that connect to drain terminals of the plurality of NAND strings.

17. The NAND flash memory of claim 16 wherein each of the plurality of discrete contact plugs is coupled to two or more corresponding NAND strings of the plurality of NAND strings, wherein each of the plurality of NAND strings is coupled to a separate corresponding drain contact plug that is not shared with the other NAND strings of the plurality of NAND strings.

18. The NAND flash memory of claim 17 wherein the plurality of discrete contact plugs and the plurality of drain contact plugs have the same shape and the same dimensions.

* * * * *